(12) United States Patent
Eid et al.

(10) Patent No.: US 9,791,470 B2
(45) Date of Patent: Oct. 17, 2017

(54) MAGNET PLACEMENT FOR INTEGRATED SENSOR PACKAGES

(71) Applicant: Intel Corporation, Santa Clara, CA (US)

(72) Inventors: Feras Eid, Chandler, AZ (US); Sasha N. Oster, Chandler, AZ (US); Kyu Oh Lee, Chandler, AZ (US); Sarah Haney, Cary, NC (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 14/141,759

(22) Filed: Dec. 27, 2013

(65) Prior Publication Data

US 2015/0185247 A1    Jul. 2, 2015

(51) Int. Cl.
| | |
|---|---|
| *H01L 27/22* | (2006.01) |
| *G01P 1/04* | (2006.01) |
| *G01P 15/097* | (2006.01) |
| *B81C 1/00* | (2006.01) |
| *B81B 3/00* | (2006.01) |
| *B81B 7/00* | (2006.01) |

(52) U.S. Cl.
CPC .............. *G01P 1/04* (2013.01); *G01P 15/097* (2013.01); *H01L 27/22* (2013.01); *B81B 3/0027* (2013.01); *B81B 7/007* (2013.01); *B81B 7/008* (2013.01); *B81B 2201/025* (2013.01); *B81B 2201/0264* (2013.01); *B81B 2203/0127* (2013.01); *B81B 2207/094* (2013.01); *B81C 1/00238* (2013.01); *B81C 1/00246* (2013.01); *B81C 1/00333* (2013.01); *B81C 1/00547* (2013.01); *B81C 2201/056* (2013.01); *B81C 2203/0172* (2013.01); *B81C 2203/0714* (2013.01); *B81C 2203/0792* (2013.01); *Y10T 29/49075* (2015.01)

(58) Field of Classification Search
CPC .... G01P 15/097; G01P 1/04; Y10T 29/49075; B81B 2201/025; B81B 2201/0264; B81B 2203/0127; B81B 2207/094; B81B 3/0027; B81C 1/00238; B81C 1/00246; B81C 1/00333; B81C 1/00547; B81C 2201/056; B81C 2203/0172; B81C 2203/0714; B81C 2203/0792
See application file for complete search history.

(56) References Cited

U.S. PATENT DOCUMENTS

| | | | | |
|---|---|---|---|---|
| 4,912,990 | A | * | 4/1990 | Norling .................... G01L 1/183 73/862.59 |
| 5,311,405 | A | * | 5/1994 | Tribbey ............... B23K 1/0016 174/259 |
| 5,345,361 | A | * | 9/1994 | Billotte .................. H01G 4/255 29/25.03 |
| 5,347,423 | A | * | 9/1994 | deNeuf .................. H01G 4/255 29/25.42 |
| 5,577,147 | A | * | 11/1996 | Arroyo .................. G02B 6/447 385/100 |

(Continued)

Primary Examiner — Sophia Nguyen
(74) Attorney, Agent, or Firm — Scwabe, Williamson & Wyatt P.C.

(57) ABSTRACT

Magnet placement is described for integrated circuit packages. In one example, a terminal is applied to a magnet. The magnet is then placed on a top layer of a substrate with solder between the terminal and the top layer, and the solder is reflowed to attach the magnet to the substrate.

20 Claims, 8 Drawing Sheets

(56) References Cited

U.S. PATENT DOCUMENTS

| | | | | |
|---|---|---|---|---|
| 5,763,783 A * | 6/1998 | Asada | G01P 15/18 | 73/514.31 |
| 6,108,470 A * | 8/2000 | Jin | G02B 6/0218 | 385/24 |
| 6,141,470 A * | 10/2000 | Espindola | G02B 6/022 | 385/24 |
| 6,222,262 B1 * | 4/2001 | Ueno | H01C 7/043 | 252/521.1 |
| 6,295,870 B1 * | 10/2001 | Hulsing, II | F02G 1/044 | 73/514.29 |
| 6,399,150 B1 * | 6/2002 | Yoshimura | H01F 41/026 | 335/306 |
| 6,414,822 B1 * | 7/2002 | Crane | G11B 5/5552 | 360/294.5 |
| 6,521,997 B1 * | 2/2003 | Huang | H01L 23/3121 | 174/255 |
| 6,624,003 B1 * | 9/2003 | Rice | B81B 7/007 | 438/106 |
| 6,700,204 B2 * | 3/2004 | Huang | H05K 1/111 | 174/261 |
| 6,778,046 B2 * | 8/2004 | Stafford | B81B 7/0077 | 200/181 |
| 6,787,700 B2 * | 9/2004 | Nagao | H01R 4/028 | 174/541 |
| 6,943,448 B2 * | 9/2005 | Gabriel | H01G 5/16 | 257/758 |
| 7,036,217 B2 * | 5/2006 | Pearson | H05K 1/113 | 228/180.1 |
| 7,621,185 B2 * | 11/2009 | Kasajima | G01P 15/18 | 73/514.31 |
| 7,696,623 B2 * | 4/2010 | Tsai | H01L 23/3121 | 257/737 |
| 7,851,247 B2 * | 12/2010 | Shih | B81C 1/00246 | 257/614 |
| 7,923,847 B2 * | 4/2011 | Galera | H01L 23/4951 | 257/686 |
| 7,960,805 B2 * | 6/2011 | Chen | B81C 1/00476 | 257/415 |
| 7,966,721 B2 * | 6/2011 | Wada | H05K 3/305 | 228/180.22 |
| 8,058,957 B2 * | 11/2011 | Irion, II | H01Q 13/085 | 333/262 |
| 8,525,354 B2 * | 9/2013 | Wu | H01L 23/291 | 257/786 |
| 8,643,140 B2 * | 2/2014 | Yang | H01G 5/16 | 257/214 |
| 8,981,501 B2 * | 3/2015 | Lin | B81C 1/00246 | 257/254 |
| 9,028,981 B2 * | 5/2015 | Yoshida | B32B 15/015 | 428/692.1 |
| 9,237,686 B2 * | 1/2016 | Motomura | H05K 13/0465 | |
| 9,260,294 B2 * | 2/2016 | Lee | | |
| 9,501,068 B2 * | 11/2016 | Lee | B81B 7/008 | |
| 2002/0017134 A1 * | 2/2002 | Sakurai | G01C 19/56 | 73/504.02 |
| 2002/0080555 A1 * | 6/2002 | Nishiyama | H01G 4/1227 | 361/302 |
| 2003/0125138 A1 * | 7/2003 | John | A63B 24/0021 | 473/415 |
| 2004/0007385 A1 * | 1/2004 | Amir | H05K 3/3447 | 174/261 |
| 2004/0188267 A1 * | 9/2004 | Sakamoto | C25D 3/12 | 205/181 |
| 2005/0099671 A1 * | 5/2005 | Matsuo | G02B 26/085 | 359/291 |
| 2005/0145029 A1 * | 7/2005 | Stewart | G01P 15/0802 | 73/514.01 |
| 2005/0161514 A1 * | 7/2005 | Ortigosa Vallejo | G06K 19/045 | 235/492 |
| 2005/0199995 A1 * | 9/2005 | Nomoto | H01L 23/12 | 257/692 |
| 2005/0239261 A1 * | 10/2005 | Tai | H01R 13/6205 | 438/380 |
| 2006/0001512 A1 * | 1/2006 | Garcia | G01D 5/145 | 335/205 |
| 2006/0079177 A1 * | 4/2006 | Okubora | H01Q 1/24 | 455/25 |
| 2006/0086773 A1 * | 4/2006 | Sanftleben | G01N 21/95684 | 228/103 |
| 2006/0260401 A1 * | 11/2006 | Xie | B81B 3/0062 | 73/514.32 |
| 2006/0261801 A1 * | 11/2006 | Busch | G01D 5/145 | 324/207.21 |
| 2007/0001802 A1 * | 1/2007 | Hsieh | H01C 7/001 | 338/309 |
| 2007/0030600 A1 * | 2/2007 | Shoji | G01P 15/105 | 360/274 |
| 2007/0180911 A1 * | 8/2007 | Shoji | G01P 15/105 | 73/514.31 |
| 2007/0186654 A1 * | 8/2007 | Shoji | B82Y 25/00 | 73/514.16 |
| 2007/0236304 A1 * | 10/2007 | Kawanami | H01P 1/32 | 333/1.1 |
| 2008/0012127 A1 * | 1/2008 | Tseng | H01C 1/028 | 257/734 |
| 2008/0053573 A1 * | 3/2008 | Sakamoto | B32B 15/011 | 148/301 |
| 2008/0075319 A1 * | 3/2008 | Kantor | H04R 9/025 | 381/420 |
| 2008/0150657 A1 * | 6/2008 | Savic | H01G 5/18 | 333/262 |
| 2008/0202237 A1 * | 8/2008 | Hammerschmidt | G01C 19/5719 | 73/504.04 |
| 2008/0236279 A1 * | 10/2008 | Matsuhisa | G01C 19/56 | 73/504.12 |
| 2008/0237818 A1 * | 10/2008 | Engel | G01D 5/147 | 257/676 |
| 2008/0251945 A1 * | 10/2008 | Chen | H05K 3/3442 | 257/779 |
| 2008/0266041 A1 * | 10/2008 | He | H01F 3/10 | 336/155 |
| 2009/0002117 A1 * | 1/2009 | Kawarai | H01F 17/0006 | 336/233 |
| 2009/0085217 A1 * | 4/2009 | Knickerbocker | H01L 21/486 | 257/774 |
| 2009/0183992 A1 * | 7/2009 | Fredenberg | B81C 99/0085 | 205/82 |
| 2009/0206943 A1 * | 8/2009 | Kawanami | H01P 1/387 | 333/1.1 |
| 2009/0261416 A1 * | 10/2009 | Raberg | B81C 1/00246 | 257/351 |
| 2009/0267165 A1 * | 10/2009 | Okudo | B81C 1/00269 | 257/415 |
| 2009/0293272 A1 * | 12/2009 | Taguchi | H01P 1/387 | 29/840 |
| 2009/0308646 A1 * | 12/2009 | Toyoda | C09D 11/38 | 174/257 |
| 2010/0002894 A1 * | 1/2010 | Lan | H04R 31/00 | 381/163 |
| 2010/0026290 A1 * | 2/2010 | Bolle | G01R 33/0052 | 324/252 |
| 2010/0039729 A1 * | 2/2010 | Heck | B82Y 10/00 | 360/110 |
| 2010/0052179 A1 * | 3/2010 | Lan | B81C 1/00246 | 257/773 |
| 2010/0116055 A1 * | 5/2010 | Lee | B81C 1/00246 | 73/514.32 |
| 2010/0176468 A1 * | 7/2010 | Ishii | B81C 1/00269 | 257/417 |
| 2010/0182111 A1 * | 7/2010 | Hagihara | H01H 50/005 | 335/203 |
| 2010/0244160 A1 * | 9/2010 | Kanemoto | G01P 15/0802 | 257/415 |
| 2011/0024274 A1 * | 2/2011 | Yoshihara | B81B 3/0021 | 200/181 |
| 2011/0062533 A1 * | 3/2011 | Park | H01L 23/13 | 257/416 |

(56) References Cited

U.S. PATENT DOCUMENTS

| | | | |
|---|---|---|---|
| 2011/0068374 A1* | 3/2011 | Tan | B81C 1/00238 257/254 |
| 2011/0074537 A1* | 3/2011 | Nakatsuji | H01F 17/0013 336/200 |
| 2011/0180930 A1* | 7/2011 | Arai | H01L 23/147 257/773 |
| 2011/0183456 A1* | 7/2011 | Hsieh | B81C 1/00246 438/53 |
| 2011/0193661 A1* | 8/2011 | Baks | H01H 50/005 335/136 |
| 2011/0209815 A1* | 9/2011 | Aono | G01C 19/56 156/146 |
| 2012/0161330 A1* | 6/2012 | Hlad | H01L 24/16 257/774 |
| 2012/0161582 A1* | 6/2012 | Chung | B81C 1/00 310/339 |
| 2012/0161909 A1* | 6/2012 | Wilson | H01H 50/005 335/203 |
| 2012/0167683 A1* | 7/2012 | Wang | G01P 15/0802 73/504.15 |
| 2012/0200377 A1* | 8/2012 | Lee | H01H 49/00 335/179 |
| 2012/0286415 A1* | 11/2012 | Sakai | H01L 24/97 257/734 |
| 2012/0319254 A1* | 12/2012 | Kikuchi | H01L 23/5389 257/659 |
| 2013/0023081 A1* | 1/2013 | Lin | H01L 21/31144 438/50 |
| 2013/0094003 A1* | 4/2013 | Abele | G02B 26/0833 353/99 |
| 2013/0120949 A1* | 5/2013 | Sun | H05K 1/185 361/782 |
| 2013/0161784 A1* | 6/2013 | Jang | H01L 23/49838 257/528 |
| 2013/0258546 A1* | 10/2013 | Kim | H01G 4/12 361/301.4 |
| 2013/0264217 A1* | 10/2013 | Kim | C25C 1/14 205/611 |
| 2013/0277777 A1* | 10/2013 | Chang | B81B 7/00 257/418 |
| 2013/0334311 A1* | 12/2013 | Pant | G06K 7/082 235/449 |
| 2014/0000377 A1* | 1/2014 | Lin | B81C 1/00246 73/754 |
| 2014/0021469 A1* | 1/2014 | Cooney, III | H01L 22/30 257/48 |
| 2014/0029157 A1* | 1/2014 | Kwag | H01G 4/30 361/301.4 |
| 2014/0076051 A1* | 3/2014 | Ma | G01P 15/097 73/514.29 |
| 2014/0130595 A1* | 5/2014 | Zhao | B81B 7/02 73/495 |
| 2014/0165723 A1* | 6/2014 | Ma | G01C 19/5776 73/504.12 |
| 2014/0167217 A1* | 6/2014 | Hu | H01L 21/76838 257/531 |
| 2014/0167909 A1* | 6/2014 | Itami | H01C 1/148 338/21 |
| 2014/0170529 A1* | 6/2014 | Jain | H01M 4/8657 429/486 |
| 2014/0182377 A1* | 7/2014 | Lin | G01P 15/08 73/514.29 |
| 2014/0206953 A1* | 7/2014 | Valdastri | A61B 5/11 600/301 |
| 2014/0217615 A1* | 8/2014 | Kuisma | H01L 25/16 257/777 |
| 2015/0001733 A1* | 1/2015 | Karhade | H01L 23/538 257/774 |
| 2015/0008540 A1* | 1/2015 | Chu | B81C 1/00238 257/415 |
| 2015/0122023 A1* | 5/2015 | Frey | G01P 15/08 73/514.31 |
| 2015/0137796 A1* | 5/2015 | Ausserlechner | G01B 7/30 324/207.2 |
| 2015/0170603 A1* | 6/2015 | Hong | G09G 3/20 345/213 |
| 2015/0185247 A1* | 7/2015 | Eid | G01P 1/04 73/514.31 |
| 2015/0189797 A1* | 7/2015 | Oster | H01L 23/552 361/679.55 |
| 2015/0257262 A1* | 9/2015 | Lee | H05K 3/107 174/251 |
| 2015/0276407 A1* | 10/2015 | Bhandari | G01P 15/18 73/504.12 |
| 2015/0282308 A1* | 10/2015 | Meyer | H05K 1/181 361/729 |
| 2015/0294521 A1* | 10/2015 | Deak | G01R 33/09 324/252 |
| 2015/0364254 A1* | 12/2015 | Ritter | H01G 2/065 174/260 |
| 2016/0280535 A1* | 9/2016 | Lee | B81B 3/0091 |

* cited by examiner

MAGNET PLACEMENT FOR INTEGRATED SENSOR PACKAGES

TECHNICAL FIELD

The present description relates to the field of semiconductor packages and, in particular, to placing magnets in the integrated sensor packages.

BACKGROUND

A variety of different types of sensors are being used in portable and mobile devices. These sensors extend beyond microphones and radio receivers to accelerometers, gyroscopes, compasses, altimeters, barometers and more. For some special purpose-built devices biometric or environmental sensors are used for medical or scientific purposes.

As miniaturization advances, there are efforts to construct sensors within smaller packages. In some cases, a sensor or a suite of sensors may be packaged together in a manner similar to an integrated circuit chip package. In other cases, sensors are combined with integrated circuits in a single package.

Some types of sensors, such as accelerometers and gyroscopes may require a permanent magnet, depending on the particular design of the sensor. The particular placement of the magnet will depend upon the design of the package.

DESCRIPTION OF THE EMBODIMENTS

Figure 1:
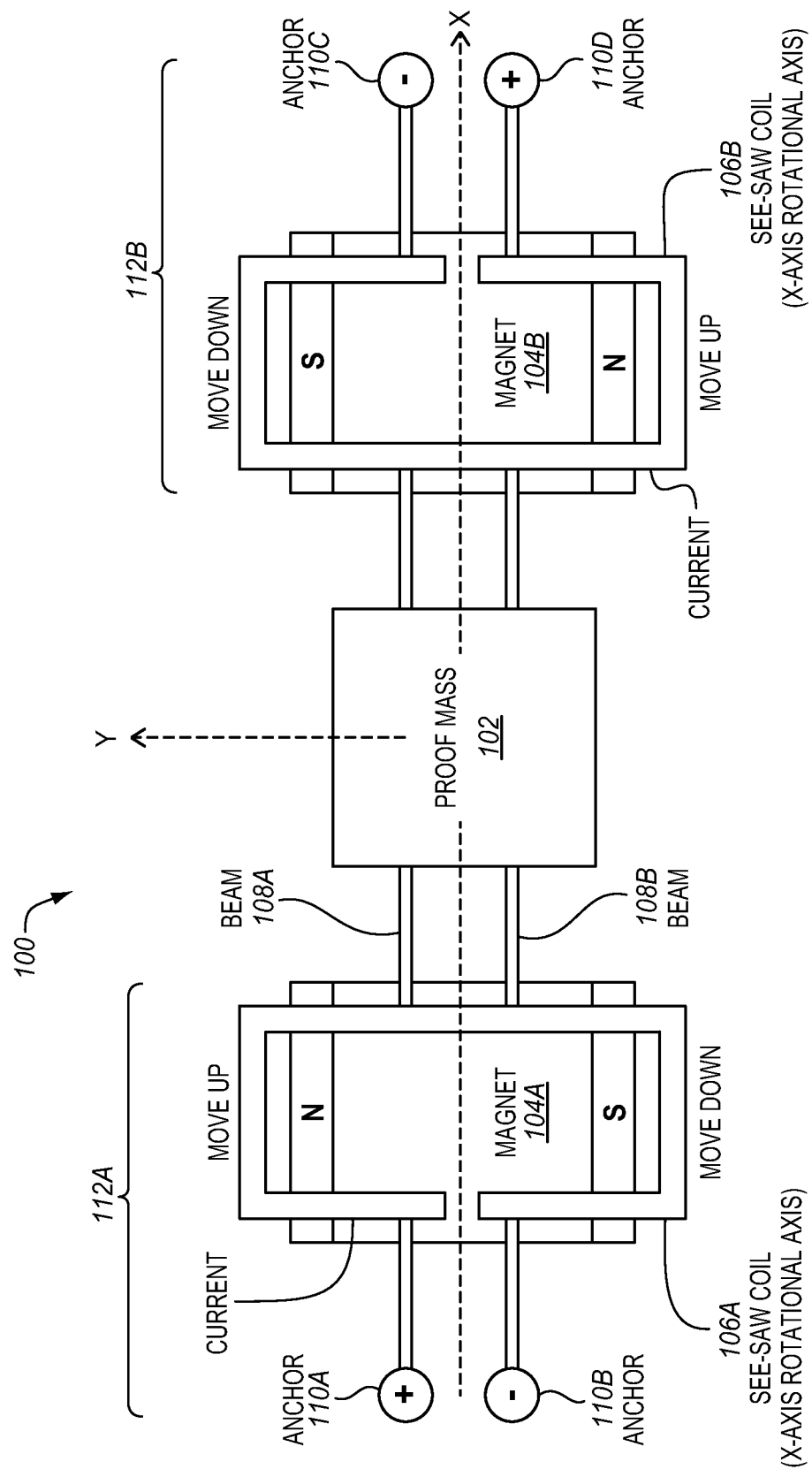
FIG. 1 illustrates a top plan view of an accelerometer that can be fabricated in accordance with an embodiment of the present invention.

A conventional chip capacitor shooter and reflow process may be used to attach magnets to substrates that contain sensors. The magnet may first be processed to have a Ni/Sn terminal. The magnet may then be placed on a pre-defined solder resist opening. The solder resist opening may be defined by being patterned on a top metal layer of a substrate. After the magnet is placed with the chip capacitor shooter, then the solder may be reflowed creating a joint between the magnet and the substrate. This attaches the magnet more quickly and with less steps than if the magnet were embedded within the substrate, or if a back side film were applied to the substrate and then a pick and place machine attaches the magnet.

In some embodiments, a sensor is integrated into a package. Magnets with metal terminals are attached to the top metal layer of the package using a chip cap shooting process. In one embodiment, metal terminals are placed only on two opposite sides of a rectangular magnet. These terminals are connected to pads patterned on the surface layer of the sensor package. The width of the magnet is designed to match the length of the sensor beam to ensure that the magnetic field is seen by the entire sensor beam.

In another embodiment, metal terminals are placed on all the four sides of the magnet. The metal terminals are connected to pads patterned on the surface layer of the sensor package so that the magnet can hermetically seal the active sensor area. This may improve the long term stability of the sensor's performance.

In one embodiment Ni/Sn metal terminals are electroplated on the edges of the magnet using a multi layer chip cap (MLCC) manufacturing process. This allows the magnet to be attached using the chip cap shooting process.

In one embodiment, solder paste is printed on a solder resist pad that is defined by the solder resist. The magnet is then aligned and placed on top of the solder paste using chip cap shooters. This is followed by a solder reflow process and a solder deflux process.

One or more embodiments described herein are directed to semiconductor packages having one or more microelectromechanical systems (MEMS) structures incorporated therein. In one such embodiment, inertial sensors, such as accelerometers or gyroscopes are fabricated in traditional or coreless substrate processing layers using metal mesh layers for protection. A magnet is placed so that its magnetic field influences the sensor structures. Structures or devices described herein may have applications in one or more of mobile/consumer products as well as in compact sensors for any of a variety of technical, industrial, or medical uses.

A variety of different embodiments are described herein. In one embodiment, the sensor fabrication is horizontally integrated into a standard or coreless substrate flow. The sensor may be an accelerometer or a gyroscope or another device. There may be one or more sensors and the sensors may be horizontally or vertically integrated into a standard or coreless substrate flow or made using any other fabrication technique. The stacked configuration may be used to reduce the number of magnets. A single magnet may be placed over two inertial sensors and its magnetic field may be used for both sensors, depending on the particular implementation.

FIG. 1 is a top plan view diagram of an accelerometer 100 that can be fabricated using coreless or standard substrate techniques. A proof mass 102 acts as the inertial mass of the accelerometer and can be fabricated in a patterned metal layer. The proof mass is suspended above and between a pair of magnets 104A, 104B that underlie respective coils 106A, 106B. Each coil accommodates a see-saw movement about the X axis. The coils are each supported by a respective beam 108A, 108B.

The beams are anchored at each end by a respective anchor 110A, 110B, 110C, 110D. The anchors provide mechanical support to the beams and electrically connect the accelerometer circuit. Together each coil and its respective components, anchors and magnet form a detector arm 112A, 112B.

When exposed to an acceleration in the right direction, the proof mass moves and thereby induces a mechanical tension in the beams increasing the resonant frequency of the beams. The change in resonant frequency can be measured by other circuitry (not shown) and related to the acceleration or change in direction of movement of the substrate.

Figure 2:
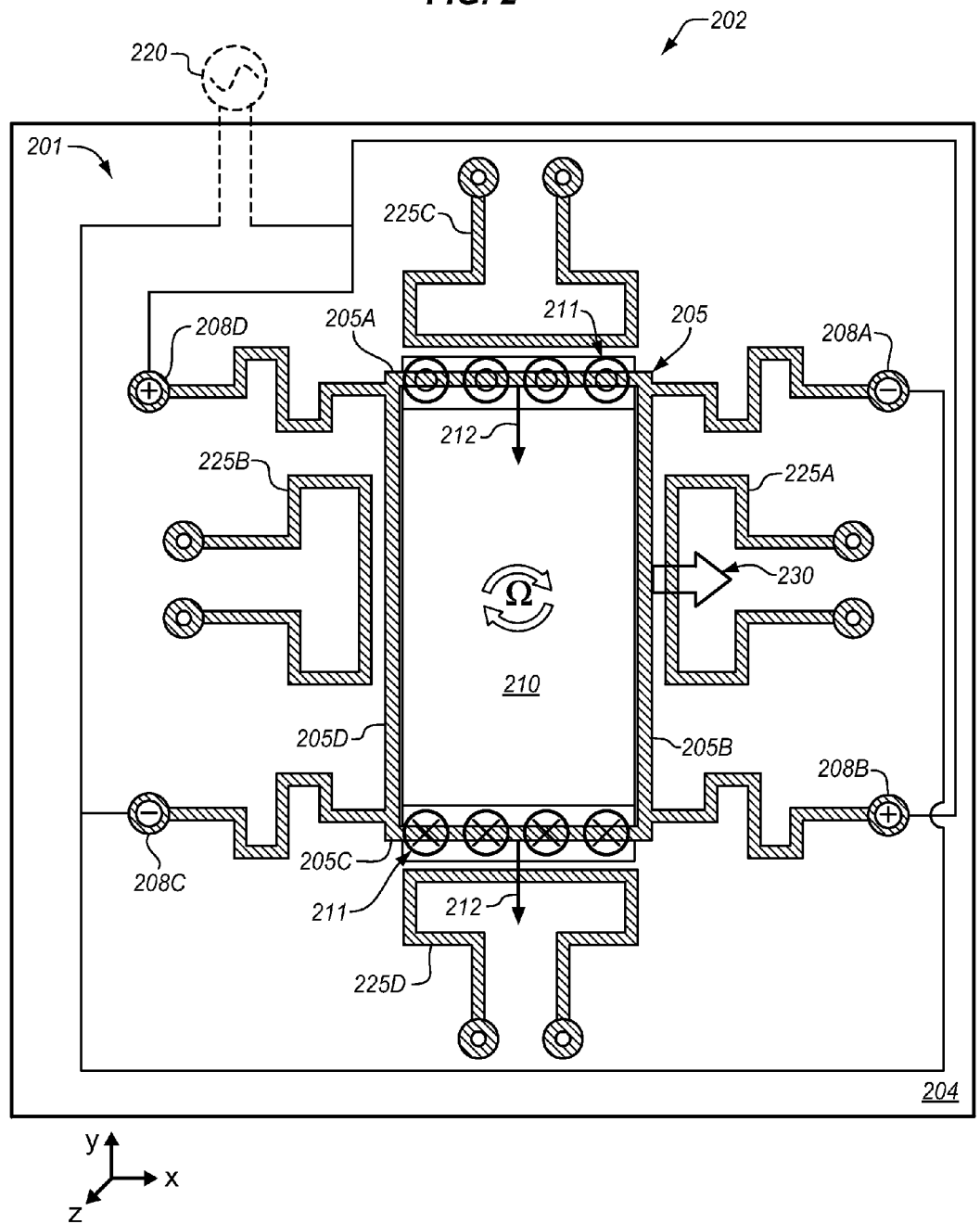
FIG. 2 illustrates a top plan view of a gyroscope that can be fabricated in accordance with an embodiment of the present invention.

As an example of gyroscope that can be fabricated using standard or coreless substrate techniques, FIG. 2 shows a top plan view diagram of an inductive gyroscope 201, in accordance with an embodiment of the invention. As shown, a conductive drive coil 205 is disposed over a substrate 204 and anchored to the substrate by conductive anchors 208A, 208B, 208C, and 208D (e.g., Cu vias). The drive coil 205 is parallel to the plane of the substrate 204 and can be formed in a patterned metal layer over a dielectric layer of the package substrate. The exemplary drive coil has orthogonal segments 205A, 205B, 205C, and 205D forming one continuous conductive trace loop.

The drive coil is positioned over a magnet 210 and within its magnetic (B) field 211. The magnetic field 211 is perpendicular to the plane of the substrate 204 with the field 211 emanating away from, and returning to the substrate 204 at the north and south poles, respectively, as illustrated.

A drive signal generator 220 provides a time varying current (e.g., sinusoidal) through the drive coil 205 generating an electromagnetic force 212 so that the drive coil 205 vibrates in one dimension relative to the substrate 204. When an external angular rotation occurs about an axis of rotation along an orthogonal dimension, the Coriolis force causes the vibrating drive coil to be displaced along a third dimension 230, orthogonal to the first and second dimensions.

Sense coils 225A, 225B register a mutual inductance induced by displacement of the drive coil 205. A first pair of sense coils 225A, and 225B is positioned on opposite side of the drive coil and parallel to two of the drive coil segments. The sense coils are fastened to the substrate and do not vibrate. Mutual inductance within the sense coils varies as a function of drive coil displacement in both the x and y dimensions. The displacement of the coil in the x-dimension resulting from the external rotation with angular velocity $\Omega$ creates a time dependent flux across the sense coils, which in turn induces a voltage across each sense coil that is correlated to the angular velocity $\Omega$. Through signal processing in other circuitry (not shown), a differential signal derived from the voltage signals registered by each of the sense coils may be used to determine the angular velocity $\Omega$. Additional sense coils 225C and 225D are formed parallel to the other two drive coil segments 205A and 205B.

Figure 3:
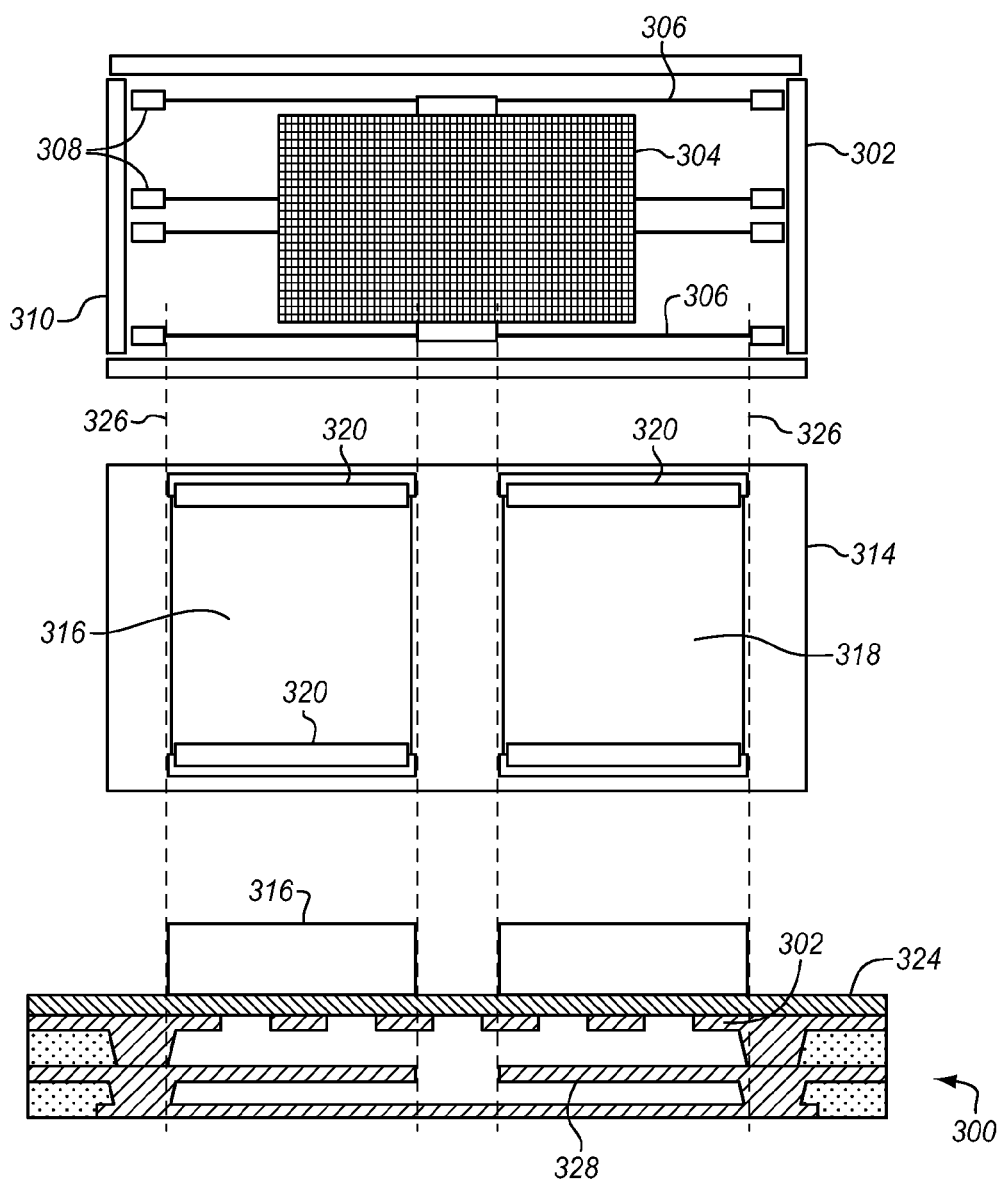
FIG. 3 illustrates a cross-sectional and exploded view of a sensor with two magnets attached in accordance with an embodiment of the present invention.

As described herein, a substrate mount process may be used to place and mount a magnet for use with an inertial sensor. FIG. 3 is a combined side cross-sectional and exploded top view of an integrated sensor package with a magnet that has two terminals. A first surface layer 302 and internal layer 328 are formed using standard package substrate fabrication techniques from copper patterns. In layer 328, a central proof mass 304 is formed beside several elongated sensor beams 306. The sensor beams have terminals 308 at their ends and a peripheral coil 310 surrounds the entire accelerometer structure. The magnet 314 is placed above the surface layer 302. The magnet has two parts on one side 316 and on the other side 318. Each of the two magnet parts has a prepared terminal section 320 at opposite sides of the magnet. These sections are prepared for attachment to the top of the substrate.

As shown in the side cross sectional view, a top metal layer 324 is applied over the protective surface layer 302. The top metal layer is prepared with surface terminals to receive the magnet. The magnet has terminals on either side which have, for example, a solder resist and nickel tin solder paste pre-applied to the terminals. The magnets are placed over the top layer 324 of the substrate 300. The assembled packaging including the magnets can then be passed into a reflow furnace to reflow the solder and attach the magnet to the metal layer. The magnet can then be defluxed for a finished package.

As can be seen in FIG. 3, the two magnets have a width which extends across the length of the sensor beams that are indicated by dotted lines 326 comparing the width of either end of the two magnets 316, 318 to the length of the elongated sensor beams 306. This allows the entire beam to be exposed to the magnetic field of the magnets. The specific dimensions of the magnet may be adapted to suit any particular application. The size of the magnet is related to the strength of its magnetic field and also affects possible placement locations.

Figure 4A:
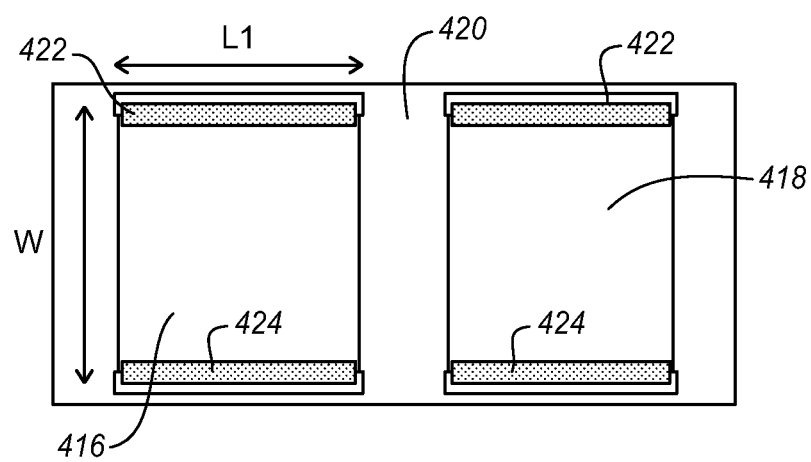
FIG. 4A illustrates a bottom plan view of two magnets with end terminals in accordance with an embodiment of the invention.

FIG. 4A shows a magnet configuration similar to that of FIG. 3. In this example there are two magnets 416, 418 which may be placed side by side on a single substrate 420. The first magnet 416 on one side of the substrate 420 is a rectangular solid, with roughly planar top and bottom faces and four edges. The magnet has a terminal along the edges of two opposite ends. Looked at another way, each magnet has a length from one side of the magnet to the other and a width in the perpendicular direction. At each end of the two magnets are the connection terminals 422 and 424. These are specifically prepared as described below to provide a clean solder connection to the substrate.

Figure 4B:
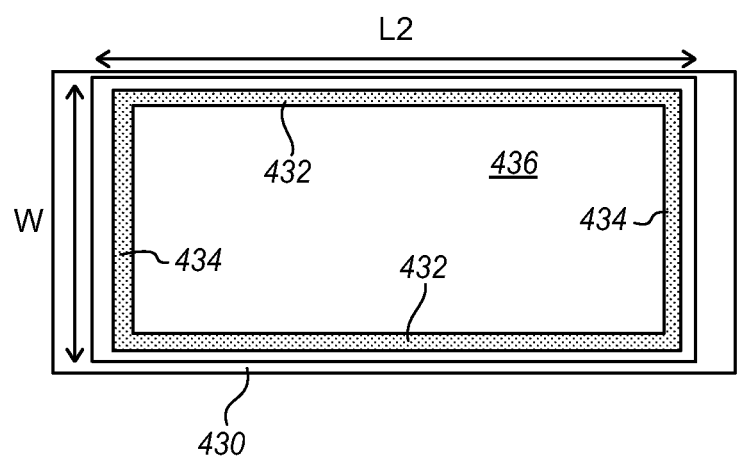
FIG. 4B illustrates a bottom plan view of a single magnet with a peripheral terminal in accordance with an embodiment of the invention.

Alternatively, in FIG. 4B a single magnet 430 is shown. The single magnet also has a long connection terminal 432 along the edge of two opposing ends of the magnet. The magnet may also have additional connection terminals 434 formed on the edges of the sides of the magnet so that the connection terminals form a perimeter encircling a surface area 436 of the magnet. The perimeter of solder connection may be used to provide a hermetic seal about the enclosed surface area. Using the magnet and perimeter as a seal may allow other sealing fabrication steps to be avoided. The seal may be more robust and more precisely placed than those of other processes.

As shown, the total magnet size in FIG. 4B is larger than the total magnet area of the two magnets of FIG. 4A. Depending on the magnet dimensions, this reduced area could correspond to a reduced magnetic field in certain regions around the magnet(s). The magnetic field strength of the magnets of FIG. 4A may be increased (in certain regions) by making the magnets thicker than the single magnet of FIG. 4B. In addition, with a constant consistent terminal enclosing a large area under the magnet of FIG. 4B, the solder connection can be used to seal the top of the substrate when the magnet is placed over the substrate and attached with a reflow process. Alternatively, the magnet of FIG. 4B may be held securely with terminals only on two opposing sides. The terminals may be on the two ends of the magnet's length 434 or its width 432.

Figure 5:
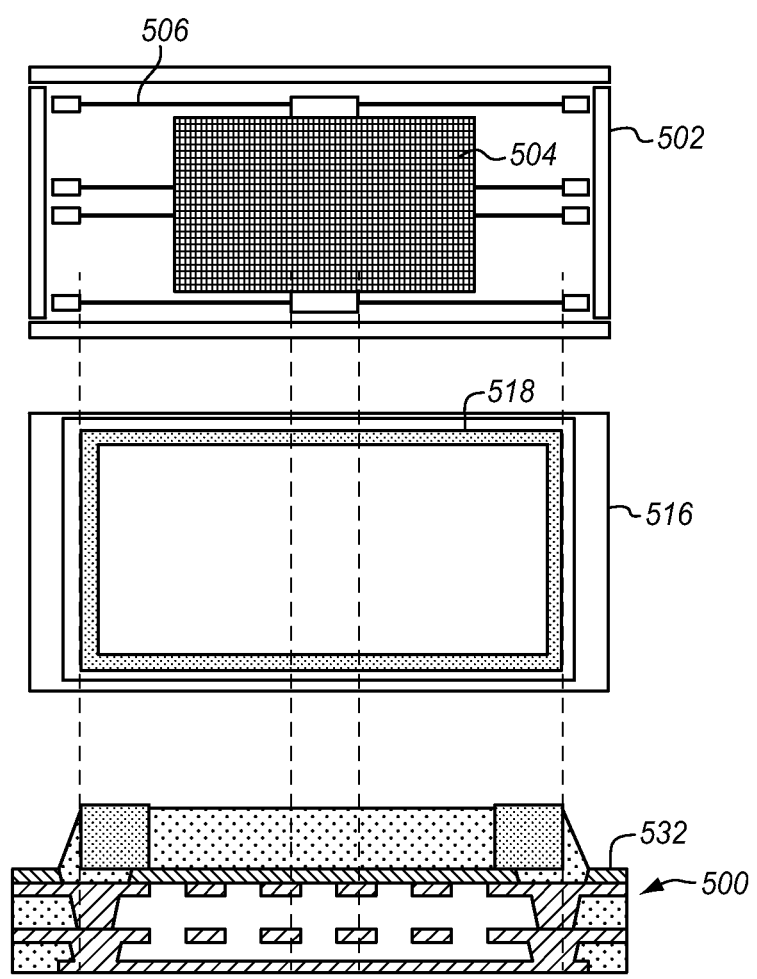
FIG. 5 illustrates a cross-sectional and exploded view of a sensor with a single magnet attached in accordance with an embodiment of the present invention.

FIG. 5 is a combined side cross sectional and exploded top view similar to that of FIG. 3. In the example of FIG. 5 a single magnet 516 is attached over the top of the substrate 500. An accelerometer 502 is formed in the internal metal layer of the substrate as in the example of FIG. 3. The accelerometer includes a proof mass 504 suspended centrally in the area of the accelerometer and sensor beams 506 that extend from one side of the proof mass to the other. The sensor beams, under the influence of the magnet 516, experience a change in resonant frequency that can be detected by circuitry (not shown). The circuitry in this and the other examples may be on the same substrate or external to this substrate on a separate die or separate package.

The magnet has a surface area on its underside. A peripheral terminal 518 extends around the periphery of this surface area. The magnet is then placed over the substrate 500 so it rests upon the top surface 532 of the substrate 500 and then is soldered to the substrate using, for example, a solder reflow process.

Figure 6A:
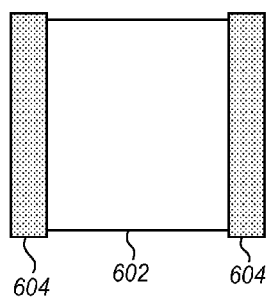
FIGS. 6A-6C illustrate top and side views of various operations in a process flow for applying end terminals to a magnet accordance with an embodiment of the present invention.

FIG. 6A shows an example of a magnet 602 in a top plan view. This magnet like all of the other magnets described herein is a permanent magnet. It may be pre-formed or fabricated using any desired process out of a variety of many different materials such as samarium cobalt or neodymium iron boron. In many cases the magnet may have a surface treatment which makes it difficult to attach the magnet terminals directly.

Figure 6B:
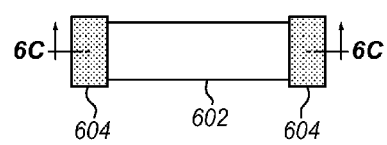
Figure 6C:
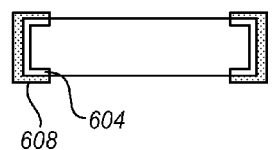

The magnet may be prepared for attachment to a substrate by first dipping the magnet 602 into an electrode paste 604 such as Cu paste. The electrode paste may then be sintered to prepare it for coating. FIG. 6A is a top plan view of the magnet with dipped ends and FIG. 6B is a side plan view of the same magnet 602 with a sintered paste 604 on each end. Following the sintering, a tin layer 608 may be electroplated over the copper 604 as shown in FIG. 6C, a cross-sectional side view of the magnet after the tin layer 608 has been applied. The magnet then has a configuration similar to that to the magnet 316 shown in FIG. 3. The terminals extend across the width of the magnet on two opposing sides. This allows for a secure connection to the top layer 324 of the substrate.

Figure 6D:
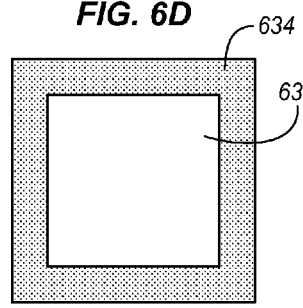
FIGS. 6D-6F illustrate top and side views of various operations in a process flow for applying peripheral terminals to a magnet accordance with an embodiment of the present invention.
Figure 6E:
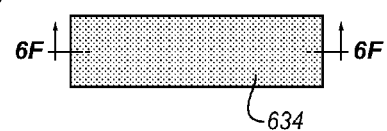
Figure 6F:
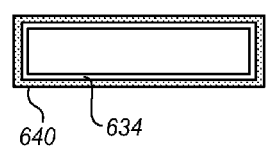

FIG. 6D shows an alternative approach for a four sided connection terminal. FIG. 6D is a top plan view of a magnet 632 similar to that of FIG. 6A. However, in the example of FIG. 6D, the magnet is dipped in electrode paste 634 on all four sides or edges of the magnet. FIG. 6E is a side plan view showing that the side is fully dipped in the electrode paste 634 and not only on the ends so that only the paste is visible. As in FIG. 6C, in FIG. 6F, the electrode paste is finished with a tin layer coating 640. FIG. 6F is a cross-sectional side view diagram of the magnet of FIG. 6E. The tin may be electroplated over the sintered electrode paste or applied in any of a variety of other ways. When subjected to a reflow furnace or other heat source, the tin is able to form a secure connection or attachment between the magnet and a substrate.

The treatment of terminals as described for magnets is similar to that used for capacitors. In a multi layer chip capacitor (MLCC) process, electrode paste is placed on the two terminals of a capacitor. While the Sn metal terminals on the magnet are referred to as terminals, they are not intended to provide electrical connections as in the sense of the terminals of a capacitor. The magnet is a permanent magnet and the metal terminals of the magnet are only for mechanical attachment. Similarly the pad or terminal on the substrate is not an electrical terminal but a mechanical attachment terminal. It has sufficient strength to hold the magnet and is made of materials that will provide a strong attachment.

The magnet terminals may be in any location on the magnet and the locations illustrated may be modified to suit any particular substrate shape or structure. In the case of two terminals, the terminals are shown as on opposite ends. This provides a rigid connection, however, the magnet terminals may be placed in any other locations. In the cases of both two and four terminals, the terminals extend across the entire length of the magnet. This allows the electrode paste to be applied by dipping. However, the electrode paste may be applied to only a portion of the magnet by first covering a different portion before dipping or in any other desired way. Alternatively, the entire length of a part of the magnet may be treated as a terminal for attachment to a terminal on the substrate that is smaller than the terminal of the magnet.

The magnets of FIGS. 6C and 6F may be attached to corresponding metal or solder terminals on a substrate whether there are two terminals or four using a chip cap mounting process. In this process solder paste is printed on pads of the substrate. The pads are defined by solder resist regions on the substrate. The magnet is then aligned and placed on top of the solder paste using, for example, chip cap shooters. The placement is followed by reflow process and then a deflux process to clean the attachment.

FIGS. 7A-7D provide an example assembly process for attaching a magnet on a top surface of a substrate. While the magnet is being shown as being attached to the top surface of the substrate it may be attached to any other surface depending on the particular implementation.

Figure 7A:
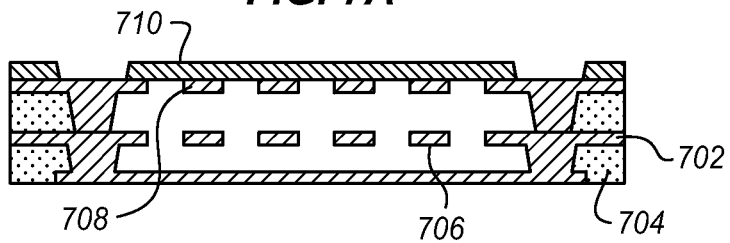
FIGS. 7A-7D illustrate cross-sectional views of various operations in a process flow for placing and attaching a magnet in accordance with an embodiment of the present invention.

In FIG. 7A a sensor integrated package 702 has been formed with a bottom substrate layer 704, a first metal layer 706 and a second metal layer 708. These metal layers may form any of a variety of different shapes and patterns depending upon the design of the particular sensor. In some cases proof masses or sensor beams may be used in layer 706. In other cases a variety of different coils and terminals may be formed in that layer. In other examples mesh screens of different types may also be formed in layer 708. While only one sensor is shown in the substrate of FIG. 7A, the package may extend horizontally to the left or right to include many other components including other sensors and electronic circuitry. In addition, there may be more layers in the package so that sensors are stacked on top of each other. As a further alternative, additional layers may be formed over the attached magnet.

Figure 7B:
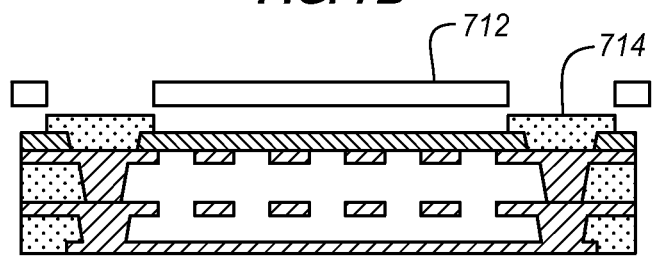

In the example of FIG. 7A solder resist 710 is patterned over the top layer of the package. In FIG. 7B a metal mask 712 is placed over the solder resist on the top of the package and solder paste is printed through the holes in the metal mask. This forms a pattern of solder paste 714 in the solder resist openings on the top of the package to which the magnet may be attached.

Figure 7C:
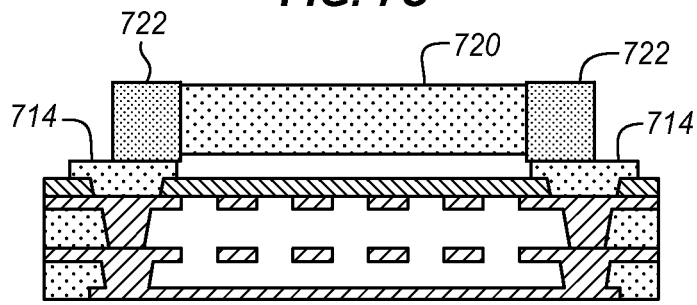

In FIG. 7C the metal mask is removed while the solder paste 714 remains in place. A magnet 720 with a terminal 722 at each end is placed over the substrate 702 so that the terminals 722 are aligned and in contact with the printed solder paste 714.

Figure 7D:
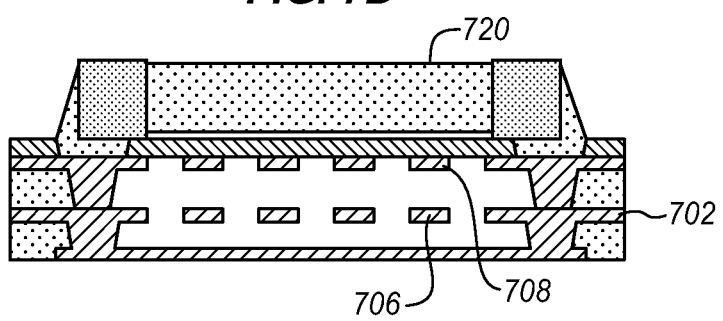

In FIG. 7D the package 702 has been exposed to a reflow process such as being baked in a reflow furnace to melt the solder paste and connect the solder paste to the magnet terminals. A deflux process then cleans the top surface of the package 702. The resulting structure has a magnet firmly attached to the top of the package 702 for use with the sensor layer 706.

While in the diagram of FIG. 7D the magnet has terminals only on each side of the magnet the terminal may extend around the entire periphery of the magnet on ends which are not shown in this cross-sectional view.

A packaged MEMS device, such as an accelerometer or gyroscope, may be housed in a variety of packaging options.

The structure as depicted in FIG. 7D can be viewed as a completed package for a combined sensor and semiconductor die (not shown). However, for specific implementations, an array of external contacts (e.g., BGA contacts) may optionally be formed above or below the depicted structure. The resulting structure may then be coupled to a printed circuit board (PCB) or similar receiving surface.

Active surfaces of the packaged semiconductor die may include a plurality of semiconductor devices, such as but not limited to transistors, capacitors and resistors interconnected together by an interconnection structure to form functional circuits. Using semiconductor die fabrication techniques, a device side of the semiconductor die may be formed. The die may include semiconductors for any of a variety of different integrated circuit devices including but not limited to a microprocessor (single or multi-core), a memory device, a chipset, a graphics device, an application specific integrated circuit according to several different embodiments. In another embodiment, more than one die is included in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in a coreless substrate.

The packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a standard or coreless substrate), or in contact with a material housed within the encapsulating film.

As mentioned briefly above, an array of external conductive contacts may subsequently be formed. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

Embodiments of the present invention may be suitable for fabricating a system on a chip (SOC), e.g., for a smartphone or a tablet. In an embodiment, a magnet is placed and attached using solder reflow technology that is used in other fabrication steps. The magnet may be used for inertial sensors or for other purposes. The same backend processing used for existing standard or coreless substrate fabrication and packaging may be used as a base flow. Alternatively, the process flow for die integration with MEMS may be applicable to other packaging substrate technologies.

Figure 8:
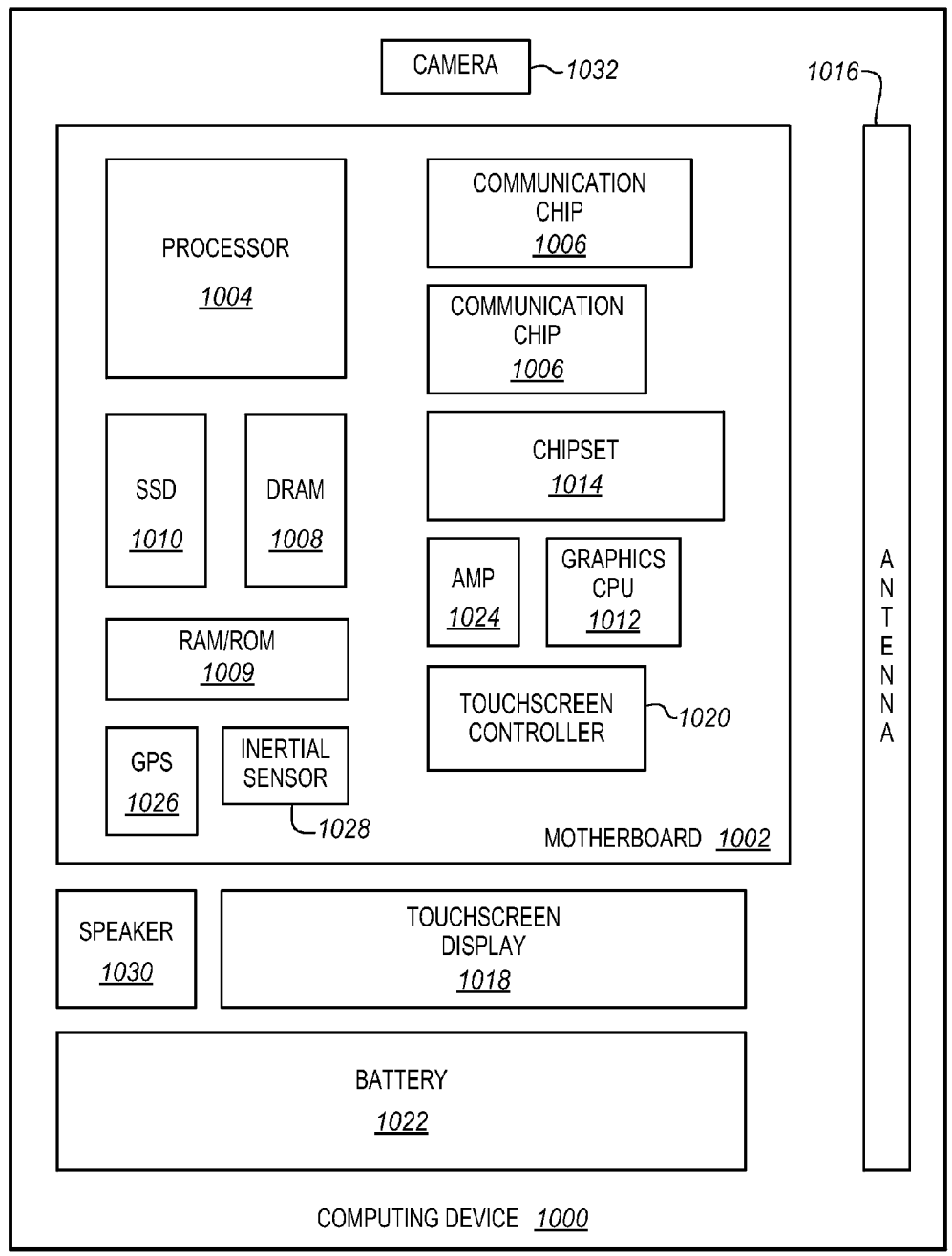
FIG. 8 is a schematic diagram of a computer system, in accordance with an embodiment of the present invention.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM) 1008, non-volatile memory (e.g., ROM) 1009, flash memory (not shown), a graphics processor 1012, a digital signal processor (not shown), a crypto processor (not shown), a chipset 1014, an antenna 1016, a display 1018 such as a touchscreen display, a touchscreen controller 1020, a battery 1022, an audio codec (not shown), a video codec (not shown), a power amplifier 1024, a global positioning system (GPS) device 1026, a compass, accelerometer, a gyroscope and other inertial sensors 1028, a speaker 1030, a camera 1032, and a mass storage device (such as hard disk drive, or solid state drive) 1010, compact disk (CD) (not shown), digital versatile disk (DVD) (not shown), and so forth). These components may be connected to the system board 1002, mounted to the system board, or combined with any of the other components.

The communication chip 1006 enables wireless and/or wired communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

In some implementations, any one or more of the components of FIG. 8, such as the integrated circuit die of the processor, memory devices, communication devices, or other components may be bump-less dies or packaged with molding compound and a redistribution layer, as described herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes applying a terminal to a magnet, placing the magnet on a top layer of a substrate with solder between the terminal and the top layer, and reflowing the solder to attach the magnet to the substrate.

In further embodiments, applying a terminal comprises applying tin to a location on the magnet. In further embodiments, applying a terminal comprises applying an electrode paste on an edge of a preformed magnet by dipping, and sintering the edge of the preformed magnet. Further embodiments include electroplating tin over the sintered electrode paste.

In further embodiments, the top layer is a metal layer. In further embodiments, the edge comprises a perimeter of a planar surface of the magnet.

Further embodiments include patterning a solder resist opening on the top layer, and placing the magnet comprises placing the terminal on the solder resist opening. Further embodiments include printing solder paste on the solder resist before placing the magnet. In further embodiments, applying a terminal comprises applying a metal terminal on each of two opposite sides of the magnet. In further embodiments, applying a terminal comprises applying a metal terminal to enclose a surface area of the magnet and reflowing the solder seals the surface area against the substrate.

In further embodiments, the surface area is a planar face of the magnet and the terminal corresponds to a perimeter surrounding the planar face. In further embodiments, the substrate comprises a sensor, the sensor having elongated beams, and the magnet is placed to extend across the entire length of the elongated beams. In further embodiments, the sensor beam is a detector beam of an accelerometer.

Some embodiments pertain to an apparatus that has a magnet having an attachment terminal, and an integrated sensor package having a top layer substrate, the magnet being placed over the substrate and having a reflowed solder connection between the magnet and the substrate to attach the magnet to the substrate.

In further embodiments, the terminal comprises a tin coating to connect to the solder. In further embodiments, the terminal comprises a sintered electrode paste on an edge of the magnet, the tin being electroplated over the sintered electrode paste. In further embodiments, the terminal comprises a coated edge on each of two opposite sides of the magnet.

Some embodiments pertain to a computing device that has an integrated sensor package. The package has a magnet having an attachment terminal, and an integrated sensor die having a top layer substrate, the magnet being placed over the substrate and having a reflowed solder connection between the magnet and the substrate to attach the magnet to the substrate.

In further embodiments, the terminal comprises a sintered copper electrode paste on an edge of the magnet covered with an electroplated tin coating. In further embodiments, the terminal comprises a metal terminal that encloses a surface area of the magnet and wherein the reflowed solder connection seals the surface area of the magnet against the substrate.

What is claimed is:

1. A method comprising:
    forming a metal mechanical sensor structure in a sensor metal layer of a package substrate;

forming a top metal layer of the package substrate over the sensor metal layer, the top layer of the substrate defining pads on opposite sides of the sensor structure;

applying a dielectric layer over the top metal layer, the dielectric layer extending across the sensor structure from one side to an opposite side of the sensor structure and patterned to expose the pads;

applying connection terminals to a magnet;

placing the magnet over the top metal layer of the substrate over the pads and over the sensor structure with solder between the terminals and the pads, the magnet being positioned to produce a magnetic field to influence the sensor structure; and reflowing the solder to attach the magnet to the substrate.

2. The method of claim 1, wherein placing comprises placing the magnet using a chip capacitor shooter.

3. The method of claim 1, wherein the magnet is preformed and wherein applying connection terminals comprises:

applying an electrode paste on an edge of a magnet by dipping; and sintering the edge of the preformed magnet.

4. The method of claim 3, further comprising electroplating tin over the sintered electrode paste.

5. The method of claim 1, wherein the top metal layer is adjacent to the sensor metal layer in which the metal mechanical sensor structure is formed.

6. The method of claim 3, wherein the edge comprises a perimeter of a planar surface of the magnet.

7. The method of claim 1, wherein the dielectric layer is applied by applying solder resist over the top metal layer and patterning solder resist openings on the dielectric layer over the pads.

8. The method of claim 7, further comprising printing solder paste on the solder resist openings before placing the magnet and wherein placing the magnet comprises placing the magnet over the printed solder paste.

9. The method of claim 1, wherein applying connection terminals comprises applying a metal terminal on each of two opposite sides of the magnet.

10. The method of claim 1, wherein applying connection terminals comprises applying a mend terminal to enclose a surface area of the magnet and wherein reflowing the solder seals the surface area against the substrate and seals the sensor structure under the magnet.

11. The method of claim 10, Wherein the surface area is a planar face of the magnet and the connection terminals correspond to a perimeter surrounding the planar face and the sensor structure.

12. The method of claim 1, wherein the sensor structure comprises elongated beams, and wherein the magnet is placed to extend across the entire length of the elongated beams.

13. The method of claim 12, wherein the elongated beams comprise a detector beam of an accelerometer.

14. An apparatus comprising:

a magnet having attachment terminals; and an integrated sensor package having a metal mechanical sensor structure in a sensor metal layer of a package substrate, a top metal layer over the sensor metal layer defining pads on opposite sides of the sensor structure, a dielectric layer over the top metal layer extending across the sensor structure from one side to an opposite side of the sensor structure and patterned to expose the pads, the magnet being placed over the pads and over the sensor structure of the substrate in a position to produce a magnetic field to influence the sensor structure and having a reflowed solder connection between the magnet attachment terminals and the pads to attach the magnet to the substrate.

15. The apparatus of claim 14, wherein the attachment terminals comprise a tin coating to connect to the solder.

16. The apparatus of claim 15, wherein the attachment terminals comprise a sintered electrode paste on an edge of the magnet, the tin being electroplated over the sintered electrode paste.

17. The apparatus of claim 14, wherein the attachment terminals comprise a coated edge on each of two opposite sides of the magnet.

18. A computing device having an integrated sensor package, the package comprising:

a magnet having an attachment terminal;

an integrated circuit die in the package; and an integrated sensor package having a metal mechanical sensor structure in a sensor metal layer of a package substrate, a top metal layer over the sensor metal layer defining pads on opposite sides of the sensor structure, a dielectric layer over the top metal layer extending across the sensor structure from one side to an opposite side of the sensor structure and patterned to expose the pads, the magnet being placed over the pads and over the sensor structure of the substrate in a position to produce a magnetic field to influence the sensor structure and having a reflowed solder connection between the magnet attachment terminals and the pads to attach the magnet to the substrate.

19. The computing device of claim 18, wherein the attachment terminals comprise a sintered copper electrode paste on an edge of the magnet covered with an electroplated tin coating.

20. The computing device of claim 18, wherein the attachment terminals comprise a metal terminal that encloses a surface area of the magnet and wherein the revved solder connection seals the surface area of the magnet against the substrate.

* * * * *